(12) United States Patent
Ali

(10) Patent No.: US 8,872,680 B2
(45) Date of Patent: *Oct. 28, 2014

(54) CALIBRATING TIMING, GAIN AND BANDWIDTH MISMATCH IN INTERLEAVED ADCS USING INJECTION OF RANDOM PULSES

(71) Applicant: Ahmed Mohamed Abdelatty Ali, Oak Ridge, NC (US)

(72) Inventor: Ahmed Mohamed Abdelatty Ali, Oak Ridge, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/782,315

(22) Filed: Mar. 1, 2013

(65) Prior Publication Data

US 2013/0307712 A1 Nov. 21, 2013

Related U.S. Application Data

(60) Provisional application No. 61/648,925, filed on May 18, 2012.

(51) Int. Cl.
*H03M 1/10* (2006.01)
*H03M 1/12* (2006.01)

(52) U.S. Cl.
CPC .............. *H03M 1/10* (2013.01); *H03M 1/1215* (2013.01); *H03M 1/1057* (2013.01)
USPC .......................................... 341/120; 341/118

(58) Field of Classification Search
CPC .... H03M 1/12; H03M 1/00; H03M 220/4233
USPC .......... 341/120, 155, 156, 118, 122, 166, 110
See application file for complete search history.

(56) References Cited

U.S. PATENT DOCUMENTS

| | | | |
|---|---|---|---|
| 7,187,310 B2 | 3/2007 | El-Sankary et al. | |
| 7,301,486 B2 | 11/2007 | Wang et al. | |
| 8,144,040 B2 | 3/2012 | Messier et al. | |
| 8,604,953 B2 * | 12/2013 | Ali | ................................. 341/120 |

OTHER PUBLICATIONS

PCT International Search Report and Written Opinion for PCT/US2013/039262, mailed on Oct. 25, 2013, 6 pages.

* cited by examiner

*Primary Examiner* — Joseph Lauture
(74) *Attorney, Agent, or Firm* — Kenyon & Kenyon, LLP

(57) ABSTRACT

A method and a corresponding device for calibrating an interleaved analog-to-digital converter (ADC) involve injecting a pulsed, substantially-random signal into a plurality of channels in the ADC. After the substantially-random signal is injected, a gain correlation value is determined for each channel, which value indicates a degree of correlation between the injected substantially-random signal and an output of the respective channel. The gain correlation values are then compared to determine a degree of mismatch between the channels. At least one of the channels is calibrated as a function of the determined degree of mismatch.

22 Claims, 5 Drawing Sheets

CALIBRATING TIMING, GAIN AND BANDWIDTH MISMATCH IN INTERLEAVED ADCS USING INJECTION OF RANDOM PULSES

CROSS-REFERENCE TO RELATED APPLICATIONS

This application claims the benefit, under 35 U.S.C. §119 (e), of U.S. Provisional Patent Application No. 61/648,925, filed on May 18, 2012, the content of which is hereby incorporated by reference in its entirety.

BACKGROUND

In interleaved analog-to-digital converters (ADCs), an analog input is applied to a common node connected to the inputs of several interleaved channels. The channels operate in an interleaved fashion, e.g., using two or more clocks to control the timing of when each channel samples the input, so that each channel operates in parallel with the other channels, but on a different time sample of the input. The outputs of the channels are then combined to generate a digital output, which is the overall output of the ADC. Mismatches between the channels cause errors in the overall output.

Mismatches can be classified as gain mismatch, timing mismatch, bandwidth mismatch or offset mismatch. The present invention relates to methods and devices for calibrating the first three types of mismatches. Techniques exist for handling offset mismatch, which is not specifically addressed by the present invention. Gain mismatch refers to differences between the gain that the input experiences from the input of a particular channel to the output of that channel. Timing mismatch refers to deviations from the intended sampling instant of a channel. For example, if the input is a sine wave, timing mismatch causes a different part of the sine wave to be seen by the sampling circuit of the channel than the channel is supposed to. This is essentially a phase offset. Therefore, the terms timing mismatch and phase mismatch are used interchangeably in this application.

Bandwidth mismatch has aspects of both gain mismatch and timing mismatch. Bandwidth is a parameter of RC circuits, usually measured at the 3 dB point. Since the sampling circuits in each channel of an interleaved ADC have switching capacitance, external resistance, and sampling capacitance, each channel can be considered an RC circuit (where RC is the resistance times the capacitance of the sampling network), which is affected by bandwidth. The gain portion of the bandwidth mismatch arises from the fact that attenuation is affected by bandwidth (attenuation increases along with the frequency of the input signal). The attenuation directly results in amplitude changes, and therefore gain changes. The timing portion of the bandwidth mismatch arises from the fact that changes in the RC time constant of the channel result in timing errors (e.g., sampling at the wrong instant or outputting at the wrong instant).

SUMMARY

New correlation-based techniques are provided to calibrate the timing, gain and bandwidth mismatch in interleaved ADCs. Mismatch between channels can cause distortion and performance degradation. The techniques employ injecting a random or pseudo-random signal (referred to as dither) that is uncorrelated with the input into the sampling network of the ADC. The random signal may be injected into a common node at the input of the interleaved channels to be sampled on the input sampling capacitances. The random signal can be any periodic signal having a pulsed waveform, e.g., a square wave or a sinusoidal wave. When the amplitudes (peak) of the pulses are injected, the gain mismatch and the amplitude portion of the bandwidth mismatch can be calibrated. When the rising edges or the falling edges of the pulses are injected, the timing mismatch and the phase/timing portion of the bandwidth mismatch can be calibrated. The injected dither is then measured digitally at the output of each respective channel to estimate that channel's gain using the Least Mean Squares (LMS) algorithm (or any other correlation algorithm). The digital gain estimate (referred to as a gain coefficient GC) represents the effect of the timing, gain and/or bandwidth of the input network, and may be used as a measure of the channel mismatch. Using the estimate, correction can be employed in the digital domain or the error can be fed back to the analog domain to correct for the mismatch error.

Correction in the digital domain involves adjusting the digital output of a mismatched channel based on the calculated GC values for the mismatched channels. For example, when the GC of a first channel and a second channel differ, the output of one of the channels, e.g., the second channel, can be digitally adjusted until the difference between the GC values of the two channels is minimized.

Correction in the analog domain involves adjusting analog components (e.g., resistances and capacitances of analog components inside each channel) until the GC values of the channels are approximately the same.

Correcting for differences in GC values results in correcting (calibrating) the gain mismatch, timing mismatch, and bandwidth mismatch.

DETAILED DESCRIPTION

Figure 1:
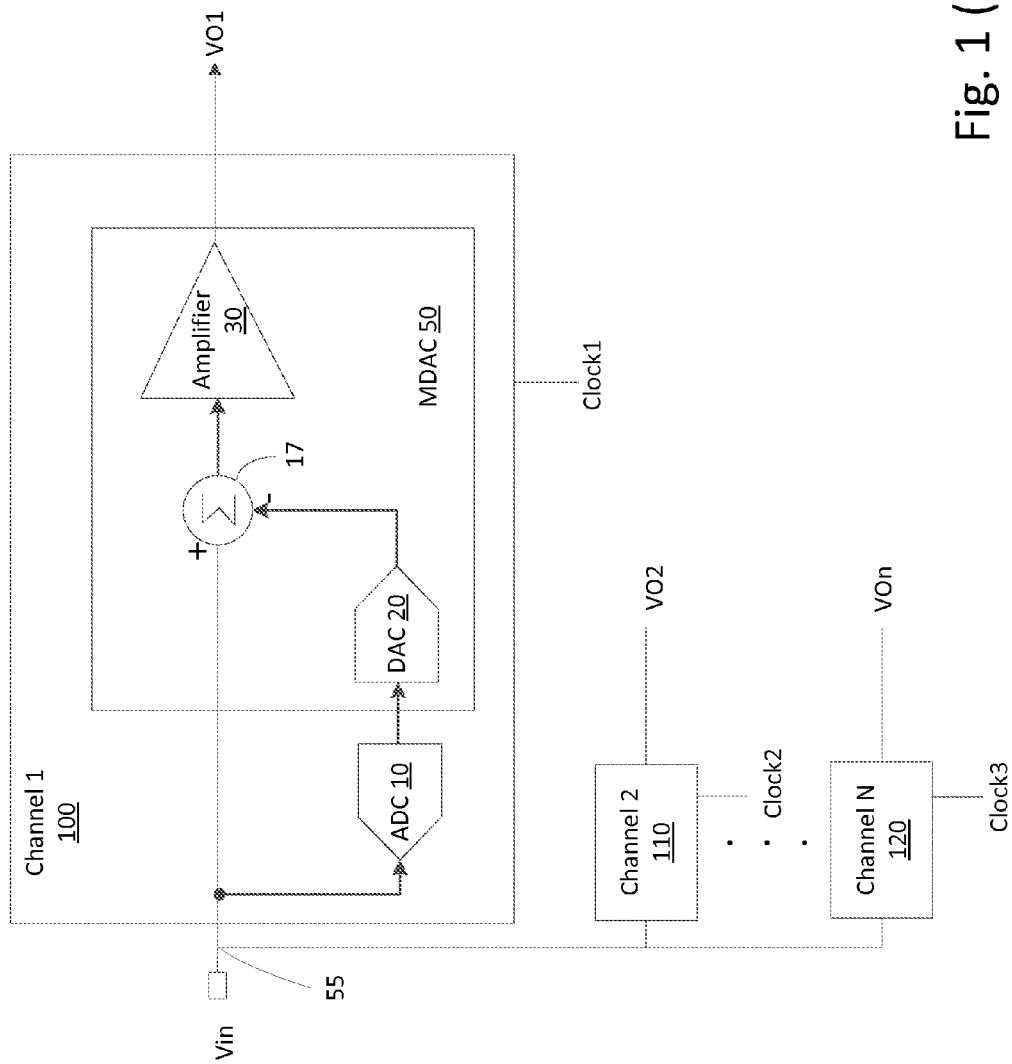
FIG. 1 shows a block diagram of a conventional interleaved ADC.

An alternative method of calibrating the three types of mismatch addressed by the present invention is described in U.S. patent application Ser. No. 13/596,626, in which dither is injected onto a capacitor that is connected in parallel to the input sampling capacitances (of a DAC component and/or a flash component) in a particular channel of an interleaved ADC. The dither is then measured digitally for that channel, by using the overall output of the ADC to estimate the gain coefficient for that channel using the LMS algorithm. This involves calculating GC values that represent the correlation between the dither injected in a previous sampling cycle and the portion of the dither that is kicked back into the input during a subsequent sampling cycle, due to residual charge stored on the sampling capacitors becoming superimposed onto the value of the input signal in the subsequent cycle. Similar to the GC values calculated according to the exemplary embodiments of the present invention, the GC values calculated using the kick-back effect can be used as a measure of the channel mismatch. The injection and GC calculation is repeated for each channel to be calibrated, and the calculated GC values are then compared to each other to perform a digital or an analog correction based on differences between the GC values.

The calibration method in U.S. patent application Ser. No. 13/596,626 relies on pre-charging the parallel capacitor to a specified dither value and then measuring how much of that pre-existing charge dissipated. However, this method has a significant disadvantage in that if the sampling duration is too long, the charge on the parallel capacitor will have dropped to zero, so that there is no voltage to gain up, and therefore gain from the injected dither cannot be detected at the output. This problem can be circumvented by using high amplitude dither so that there is still some residual charge on the parallel capacitor, which charge is attributed to the dither.

To avoid using high amplitude dither, example embodiments of the present invention involve injecting dither (e.g., a charge or a voltage) directly into the sampling capacitances in each channel, in the form of a pulsed signal applied to the analog input signal of the ADC. The pulsed signal can be any periodic signal having a pulsed waveform. In the exemplary embodiments discussed below, the pulsed signal is a voltage signal. However, it is equally possible to use a current signal as the pulsed signal. If the dither is applied to a common input point of all the channels, then the dither becomes superposed onto the analog input and each channel will sample the dither along with the input. A correlation algorithm such as the LMS algorithm can then be applied to an output of each channel to calculate a GC value for that channel. The GC values for each channel can be compared and the channels may be adjusted accordingly, using analog or digital techniques until the GC values of all channels are approximately the same, at which point the channels are considered sufficiently matched.

FIG. 1 shows a block diagram of a conventional interleaved ADC. Three channels 100/110/120 are connected in parallel to an input Vin. Each channel is shown as having a single stage for illustration purposes. However it will be understood that channel may be formed by pipelining multiple stages. Pipelining, however, is optional. For illustration purposes, only the first two channels and the final (Nth) channel are shown. However, the interleaved ADC may have any number of channels. The first channel 100 may include an ADC 10 (also known as a "flash") and a multiplying digital-to-analog converter (MDAC) 50. The MDAC 50 includes a digital-to-analog converter (DAC) 20 and an amplifier 30. Vin is input to the ADC 10 to generate a digital input to the DAC 20, which in turn converts the digital output of the ADC 10 back into an analog signal. The analog output of the DAC 20 is then subtracted from Vin and the result input to the amplifier 30 to generate an analog output voltage VO1, which can be used as input to the next stage if the channel is a pipelined channel. The channels 100/110/120 may include similar components and, as with the channel 100, the channels 110 and 120 may also be pipelined. Each channel 100/110/120 is controlled by a respective clock input (Clock1, Clock2 and Clock3) to operate in an interleaved manner with the other channels of the ADC.

The timing configuration of the clock inputs can vary. For instance Clock1 and Clock2 may be phase offset, then the next channel after Channel 110 (not shown) may be connected to a clock that is in-phase with Clock1, so that the phases of the clocks alternate in successive fashion. In another embodiment, each of the clocks may operate on different phases. For example, as explained below, the clocks may have different phases that are equidistantly spaced. Other configurations are also possible.

In the proposed techniques, a dither signal is injected in the input network and detected in the digital output of the ADC. The dither signal is injected into each channel, via a common point where the channels meet, e.g., the node 55 in FIG. 1, where the input Vin is applied. In this manner, the dither signal is applied to the flash component at the input of each channel. The dither signal is therefore sampled by each channel along with the input during a respective sampling instant for the channel.

The dither can be injected as a randomized flat pulse (e.g., a square pulse), or any other pulsed waveform. The amplitude of the dither can be varied randomly (e.g., between +1 and −1 volts, or between +2, +1, −1, and −2 volts). Varying the amplitude affects not only the amplitude, but also changes the slope of the pulse, and therefore the rise and fall time of the edges.

Figure 2:
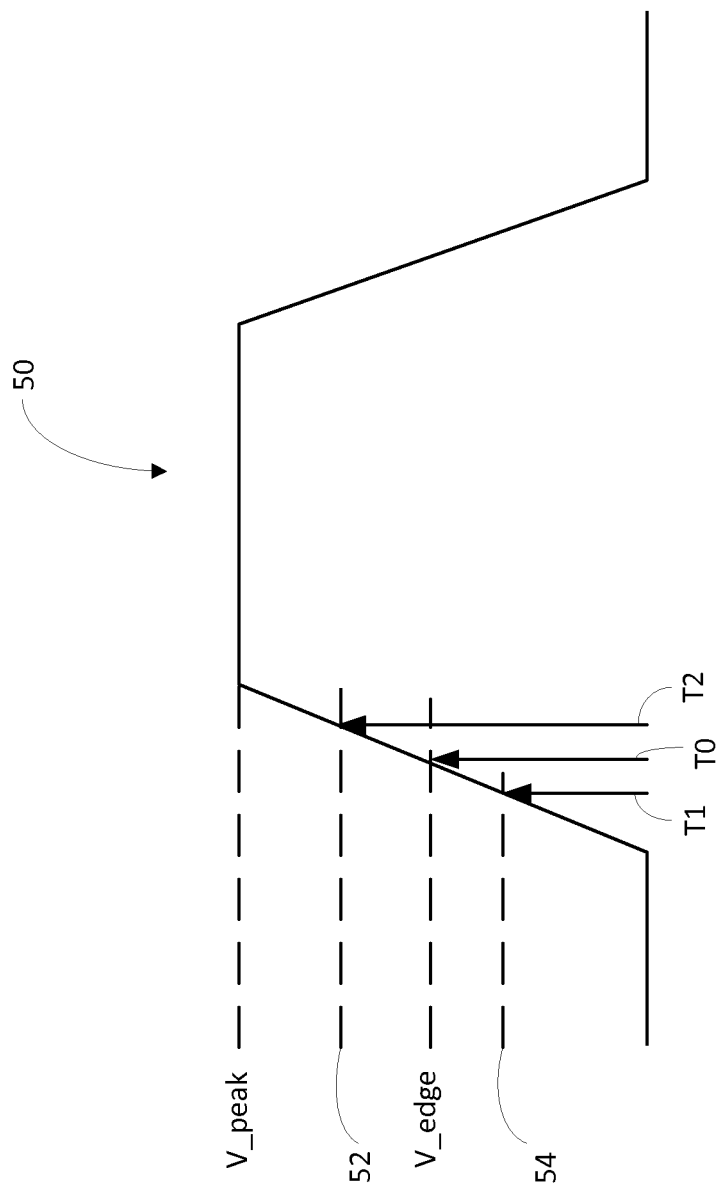
FIG. 2 shows a single pulse of an exemplary dither signal according to the present invention.

Referring to FIG. 2, a single pulse of an exemplary dither signal 50 is shown with an amplitude V_peak, which corresponds to the peak value of the pulse. If the amplitude V_peak is to be applied, then the dither signal 50 is connected to the common node 55, e.g., using a switch that connects the dither signal 50 directly to the common node 55 at a time when the value of the dither signal 55 is equal to V_peak. Additionally, the timing of the dither signal 50 is selected relative to the sampling instant of a channel such that the channel will then sample V_peak along with the input Vin during the respective sampling instant of the channel. One way to do this is to generate the dither signal 50 so that it is in-phase with the clock that controls the sampling of a particular channel. If all the channels operate on clocks that are essentially identical, except that the clocks are phase offset relative to each other, then it is possible to generate the dither signal such that each channel will sample the same portion of a respective pulse when the channels are matched. Thus, assuming the channels are matched, V_peak may be subsequently sampled by another channel in response to V_peak of a subsequent pulse (not shown). This may continue indefinitely as long as the dither signal 50 remains connected to the common node 55. When there is gain mismatch or bandwidth mismatch, the mismatched channels will produces different outputs in response to sampling the dither. Therefore, when the amplitude is applied, the outputs of the channels can be used to determine GC values that indicate the gain mismatch and/or the amplitude portion of the bandwidth mismatch between the channels.

If the edge is to be applied, the dither signal 50 is generated such that the sampling instant of the channel coincides with a rising or falling edge of a pulse. In FIG. 2, a voltage V_edge along a rising edge corresponds to the dither voltage that is sampled if the sampling occurs at an ideal sampling instant T0. When channels are mismatched, the sampling instant can vary. For example, if the sampling instant is T1, a lower voltage 54 is sampled, whereas if the sampling instant is T2, a higher voltage 52 is sampled. Unlike the amplitude, the continuously changing nature of the rise edge or the falling edge makes the edge more sensitive to timing errors, e.g., phase shifts, because even a small difference in sampling instants will result in sampling substantially different dither values, as FIG. 2 shows. Therefore, when a rising edge or falling edge is applied, the outputs of the channels can be used to determine GC values that indicate the timing mismatch and the phase portion of the bandwidth mismatch between the channels.

Figure 3A:
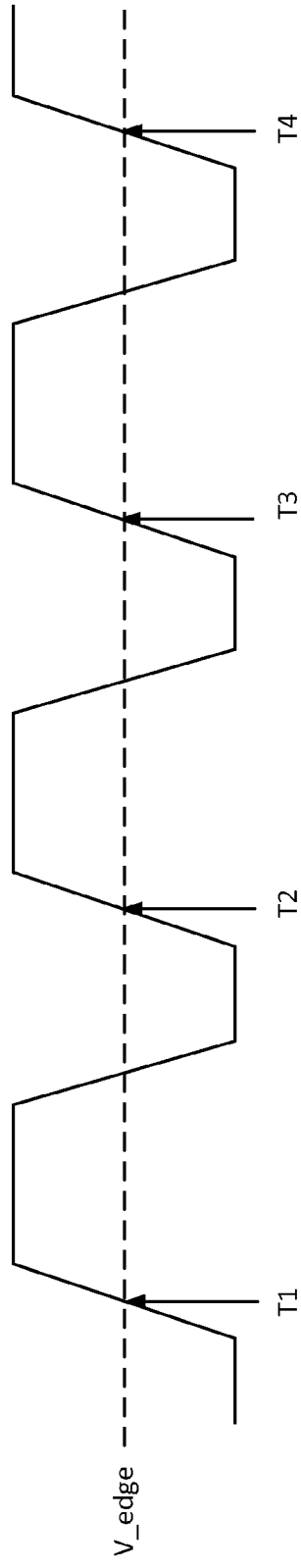
FIG. 3A shows sampling instants of matched channels relative to an exemplary dither signal.
Figure 3B:
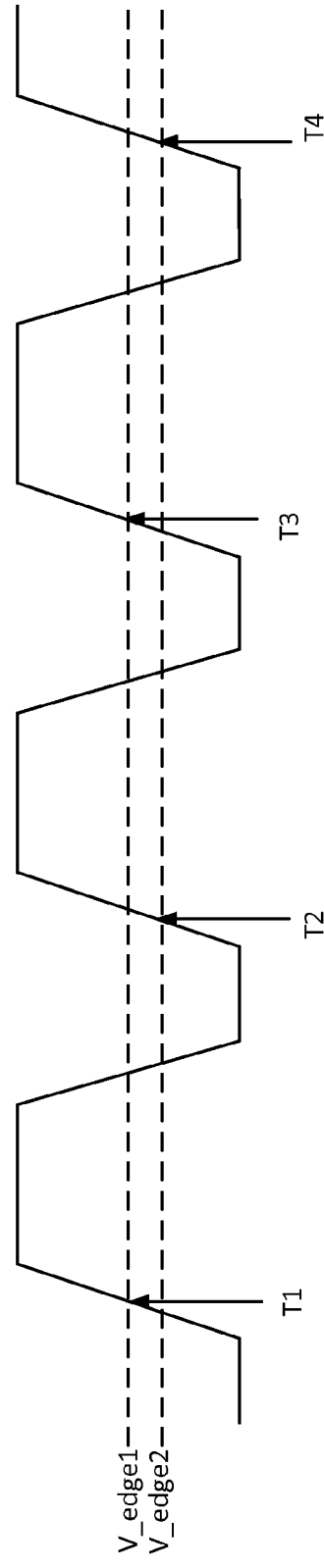
FIG. 3B shows sampling instants of mismatched channels relative to an exemplary dither signal.

FIGS. 3A and 3B more clearly illustrate the effect of timing mismatch between two channels. In this example, the two channels use different phases of essentially the same clock to control their respective sampling instants. Ideally the phases should be equidistant, so that the channels should all sample the same edge or the same amplitude. For example, if there are only two channels, the phase difference between the clocks of the two channels is 180 degrees. If there are three channels, the phase difference is 120 degrees, and so on. Thus, the phase difference between these clocks depends on the number of channels interleaved. However, timing mismatch changes the relative spacing of the phases, such that the channels will sample different edge amplitudes. In FIG. 3A, the channels are matched relative to each other and a first channel samples V_edge during sampling instants T1 and T3, while a second channel samples V_edge during sampling instants T2 and T4. In FIG. 3B, the two channels are mismatched, such that the first channel samples V_edge1 during sampling instants T1 and T3, while the second channel samples V_edge2 during sampling instants T2 and T4.

Figure 4:
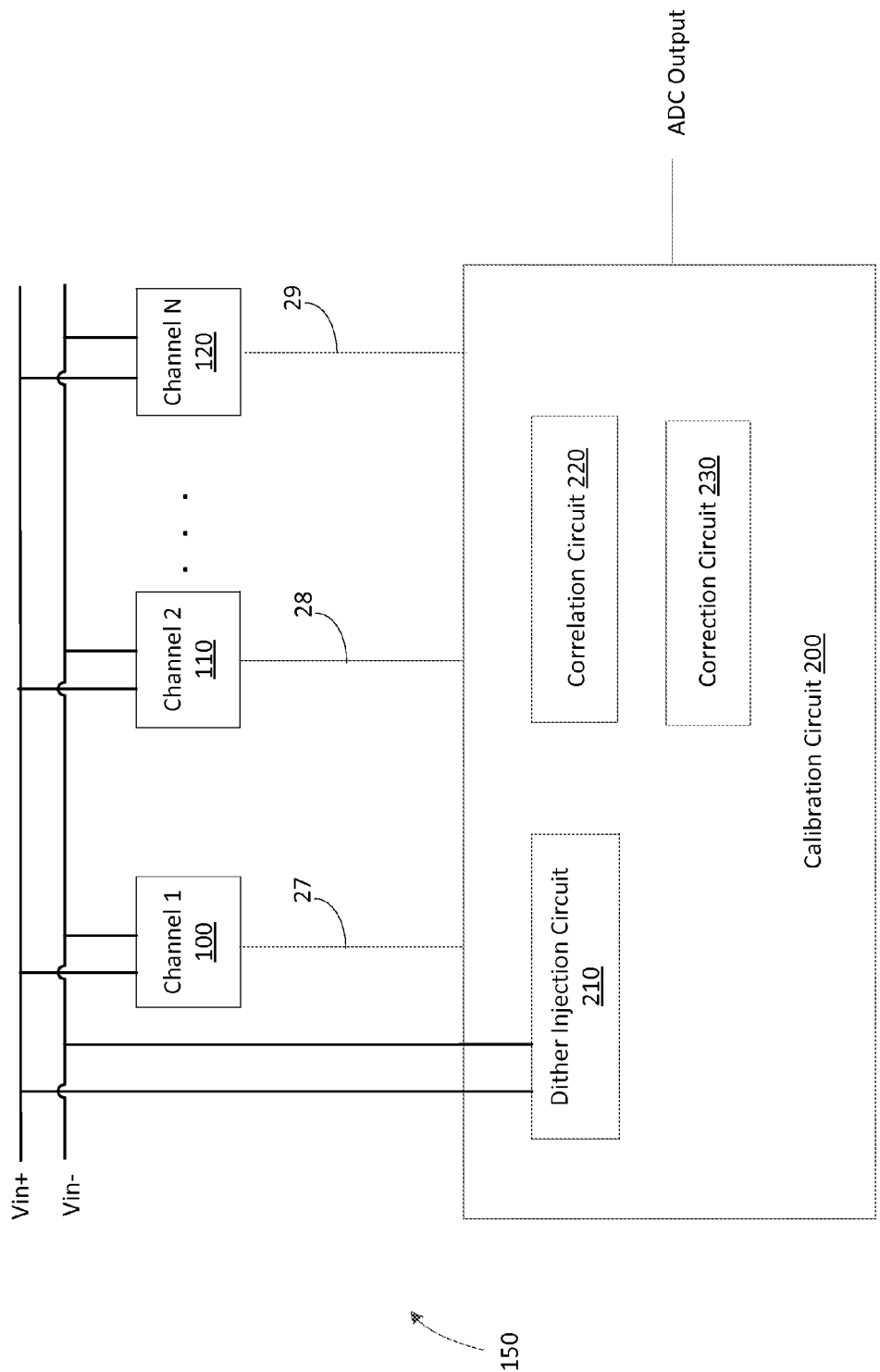
FIG. 4 shows an exemplary system for calibrating timing, gain and bandwidth mismatch according to the present invention.

FIG. 4 shows a block diagram of an exemplary system 150 for calibrating timing, gain and bandwidth mismatch according to the present invention. The system 150 may include the interleaved ADC from FIG. 1, in addition to a calibration circuit 200. The calibration circuit 200 may include a dither injection circuit 210, a correlation circuit 220, and a correction circuit 230. Each channel is shown connected to a pair of differential inputs Vin+ and Vin−. The circuitry for generating the dither signal has been omitted. However, one of ordinary skill in the art would understand how to generate a suitable dither signal using conventional circuit elements such as a digitally controlled oscillator.

The dither injection circuit 210 may include a circuit arrangement for generating and injecting dither into the common node at which the input Vin1+ or Vin1− is applied. The dither injection circuit 210 determines the amplitude of the dither signal randomly or pseudorandomly to ensure that the dither is uncorrelated with the input. The dither injection circuit 210 may control the phase offset of the dither signal so that either an amplitude or an edge is sampled by each of the channels. For instance, the dither injection circuit 210 may set the edges of the pulses to be sufficiently long to guarantee that the edges are sampled. This may be performed by adjusting the rise time or fall time of the pulses. Similarly, the dither injection circuit 210 may control a duration of the amplitude, e.g., by adjusting the width of the pulses to ensure that an amplitude of each pulse is sampled by each respective channel.

The calibration circuit 200 may include a correlation circuit 220 for processing output signals 27 to 29 from the channels. Each of the outputs 27 to 29 corresponds to the output of a respective channel. In this example, the output 27 is the output of channel 100, the output 28 is the output of channel 28, and the output 29 is the output of channel 120. The outputs 27 to 29 may be digital outputs, each of which is obtained by combining the digital outputs of the flashes in a respective channel. The outputs of all the channels may be combined to generate an overall output of the ADC. This may be performed for example, using appropriate circuitry located in the calibration circuit 200. Alternatively, the combining circuitry may be located outside the calibration circuit 200.

The correlation circuit 220 may obtain the output of each channel and correlate the dither (e.g., the amplitude V_peak or the ideal edge value V_edge) to the output of each channel. The correlation may be performed using any statistical correlation technique. In one embodiment, the correlation technique used is the LMS algorithm. Applying an LMS algorithm, the correlation circuit 220 may digitally separate (de-correlate) the dither and the input Vin1+ or Vin1− to obtain an estimate of the gain that the dither experienced after propagating through each channel. The following LMS algorithm is exemplary:

$$Gc_{n+1}(k)=Gc_n(k)-\mu*Vd_k*[Vd_k*Gc_n(k)-Vin_k] \quad (1)$$

Gc(k) is the dither coefficient from sample k, μ is the algorithm step-size, $Vd_k$ is the dither injected (e.g., V_edge or V_peak) and $Vin_k$ is the portion of the current input (or digital output) of the ADC that is represented by the output of a particular channel for which GC(k) is being calculated, and includes information generated in response to the dither-modified input. For example, $Vin_k$ can be any one of the outputs 27 to 29 in FIG. 2. If the GC is to be calculated for the channel 100, then the output 27 may be obtained at an appropriate time after the output 27 has been generated in response to sampling the input Vin together with a dither edge or a dither amplitude.

The correction circuit 230 may perform the analog and/or digital correction based on the estimated gains. When multiple channels are mismatched, one channel can be selected as a reference channel and the remaining channels adjusted to match the reference channel. The selection of the reference channel can be arbitrary and any channel can be designated as the reference channel. For example, the lowest numbered channel can be selected, the highest numbered channel can be selected, or a channel can be selected at random.

Digital correction may be performed by adjusting the digital output of one channel so that the gain/timing/bandwidth characteristics of the channel match the characteristics of another channel. The channels need not be exactly matched as long as the mismatch remaining after correction is small enough that the overall ADC output is reasonably accurate. One way to perform digital correction is to increment a multiplier term applied to the output of a particular channel. To obtain the digital correction, the multipliers associated with all the channels except the reference channel may be modified to cancel the deviation between their respective GC values and the reference channel. For example, if the GC of channel 1 is smaller than the GC of channel 2, the reference channel can be channel 2 and the multiplier of channel 1 can be increased while keeping the multiplier of channel 2 the same. Alternatively, the multiplier of channel 2 may be decreased while keeping the multiplier of channel 1 the same or increasing the multiplier of channel 1 only slightly.

Another way is to force the GC of a mismatched channel to be the same as the reference channel. For example, if channels 1 and 2 are mismatched, the output of channel 2 can be multiplied by GC1/GC2, leaving GC1 unchanged. This is essentially the same as applying a first digital correction term of (1 minus GC2) to channel 2 to cancel out GC2, then adding GC1 as a second correction term to channel 2. Such a correction would reduce gain mismatch, but not timing mismatch.

Correction in the analog domain can be done using a feedback loop to adjust RC components (e.g., adjustable resistances or capacitances in each channel). One RC component that can be adjusted is a switch (e.g., an MOS transistor) connected to the sampling clock. The resistance of this switch can be adjusted by changing its input voltage. Analog feedback can also be used to adjust the timing of the sampling clock of any a particular channel. For example, the sampling clock for a mismatched channel can be phase-shifted left or right until it is aligned with that of the other channels.

Analog correction may involve iteratively changing circuit parameters of one or more stages in the channel being adjusted until the mismatch between both channels is determined by the correction circuit 320 to be sufficiently reduced. For example, the timing of the clock input to channel 1 may be phase-shifted to the left or right until the GC of channel 1 matches the GC of channel 2. The direction of the shift depends on the polarity of the error, e.g., the sign of the difference between the GC of channel 1 and the GC of channel 2. For example, a left shift may be used to increase the GC of channel 1 in response to a negative error, since a negative sign indicates that the channel 1 GC is smaller than the channel 2 GC. The correction may be performed each time a new GC difference is calculated and correction may be terminated when the GC difference is below some predefined threshold value.

Alternatively, timing adjustment can be done by changing the voltage level of the sampling clock or of the DC voltage bias of the sampling switch (the MOS transistor mentioned above) located in the MDAC of one or more stages in the mismatched channel. The sampling instant may occur when the gate-to-source voltage (Vgs) of the transistor device that forms the sampling switch falls below the threshold value of the device. If the gate voltage (which is the sampling clock level) or the source voltage (which is set by the DC bias of the sampling switch) is adjusted, the sampling instant will change.

Other circuit parameters may be used for analog correction, including adjusting the RC components in one or more stages in the mismatched channel. For example, the resistances of the switches in a selected stage may be adjusted by including an adjustable resistor in series with the switches or by making the resistances of the switches themselves adjustable. As an alternative to adjusting resistance, the sampling capacitors may be adjustable and their capacitance values adjusted to alter the RC time constant of the stage until the GC difference is minimized (if the GC of channel 1 is larger, this means there was less signal decay and therefore channel 1 has a larger RC time constant, which could then be reduced by, e.g., lowering the resistances or capacitances in one or more selected stages of channel 1).

In addition to the correction techniques discussed above, other types of analog or digital corrections may be performed. For example, analog correction of gain mismatch can be done by adjusting capacitor values, but may change the timing and bandwidth as a result. Digital correction of timing mismatch may be possible by interpolating between signals sampled by different channels to estimate the correct value. For example, if Channel 100 is being adjusted, the values sampled by Channel 110 may be interpolated to estimate, based on the phase difference between Clock1 and Clock2, and based on the degree of timing mismatch indicated by the GC difference, what value should be sampled by Channel 100, and then adjusting the actual value sampled by Channel 100 as a function of the difference between the actual value and the estimated value.

Figure 5:
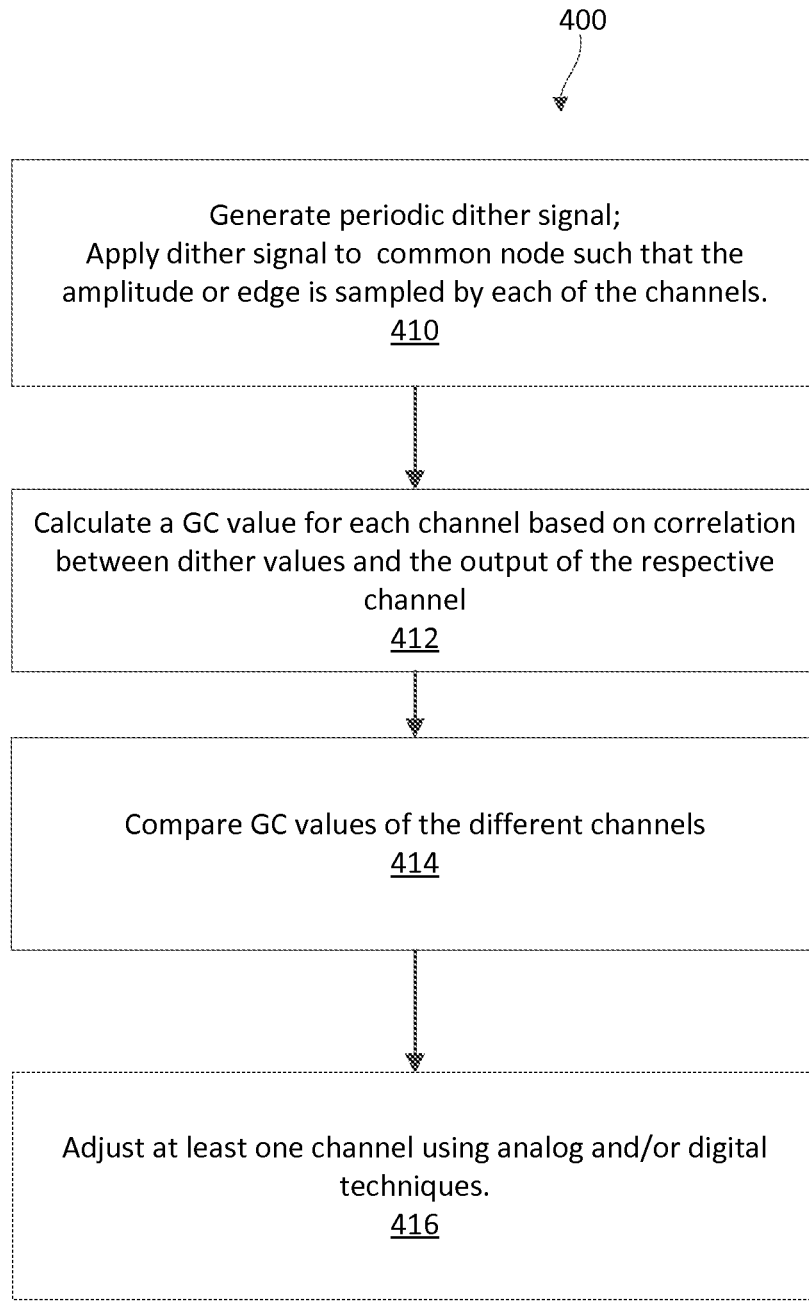
FIG. 5 shows an exemplary method for calibrating timing, gain and bandwidth mismatch according to the present invention.

FIG. 5 shows an exemplary method 400 for calibrating timing, gain and bandwidth mismatch according to the present invention. The method 400 may be used in connection with the system in FIG. 4 and begins at step 410, where the dither, which is a random or pseudo-random value, is generated as a pulsed signal and applied at a suitable time to the common node where the input Vin is also applied. As explained above, the pulse characteristics (e.g., rise or fall time and pulse width) and the phase offset of the dither signal can be controlled such that either an amplitude or an edge is sampled by each of the channels.

At 412, a GC value is calculated for each channel by applying the dither value and the output of the respective channel to a correlation algorithm.

At 414, the GC values for the channels are compared to each other and if the GC values are sufficiently different, the channels are determined to be mismatched. For example, if the difference between the GC values of a first channel and a second channel is greater than a threshold difference value, then the first and the second channels may be considered mismatched to each other. The GC value of at least one of the mismatched channels can then be compared to the GC value of a further channel to determine whether it is necessary to adjust one or more of channels. For example, if the GC value of the first channel is close to the GC value of a third channel, then the second channel may be adjusted to more closely match the first and the third channels.

At 416, at least one channel is adjusted using analog and/or digital techniques so that in a subsequent GC value calculated for the at least one channel more closely matches the GC value of the remaining channels. Gain and timing adjustments can be separately performed, e.g., using trial-and-error, to determine which has a better mismatch reducing effect. The degree of adjustment may vary as a function of the degree of mismatch, e.g., larger GC differences may require larger adjustments. Steps 410 to 416 may be repeated until the GC value of all channels is approximately the same, at which point the channels are considered sufficiently matched.

In the preceding specification, the present invention has been described with reference to specific example embodiments thereof. It will, however, be evident that various modifications and changes may be made thereunto without departing from the broader spirit and scope of the present invention as set forth in the claims that follow. For example, edge injection and amplitude injection may be used in isolation or together. In one embodiment, an initial calibration may be performed using the amplitude of a first dither signal, to perform a gain adjustment. This initial calibration may be followed with an additional calibration using edges of a second dither signal, to perform a timing adjustment. The two dither signals can be applied simultaneously, so that the first dither signal injects its amplitudes while the second dither signal injects its edges. The sampling instants for the edge and the amplitude may even be the same. The two dither signals can also be injected in an alternate manner periodically or in a random fashion (i.e., randomly switching between the peak-pulse signal and the edge-pulse signal). Since the calibration circuit controls the timing of the injections, it knows what to expect at the output of the channels. Therefore, either edges or pulses may be injected, so long as the pulse amplitudes themselves are substantially random.

The embodiments described herein may be combined with each other in various combinations. The specification and drawings are accordingly to be regarded in an illustrative rather than restrictive sense.

What is claimed is:

1. A method for calibrating an interleaved analog-to-digital converter (ADC), comprising:
   injecting a pulsed, substantially-random signal into a plurality of channels in the ADC;
   after the substantially-random signal is injected, determining for each channel a gain correlation value indicating a degree of correlation between the injected substantially-random signal and an output of the respective channel;
   comparing the gain correlation values to determine a degree of mismatch between the channels; and
   calibrating at least one of the channels as a function of the determined degree of mismatch.

2. The method of claim 1, wherein the substantially-random signal is injected onto an analog input of the ADC, the analog input forming an input to each of the plurality of channels.

3. The method of claim 1, wherein the calibrating includes at least one of an analog and a digital adjustment to the at least one channel.

4. The method of claim 3, further comprising:
performing the adjustment by phase-shifting a clock input of the at least one channel.

5. The method of claim 3, further comprising:
performing the adjustment by changing an RC time constant of a stage in the at least one channel.

6. The method of claim 5, wherein the RC time constant is changed by adjusting a capacitance in the at least one channel.

7. The method of claim 5, wherein the RC time constant is changed by adjusting a resistance in the at least one channel.

8. The method of claim 3, further comprising:
performing the adjustment by changing a value of a multiplier applied to an output of the least one channel.

9. The method of claim 1, further comprising:
determining the degree of mismatch by calculating a difference between the gain correlation value of the at least one channel and the gain correlation value of at least one additional channel.

10. The method of claim 1, further comprising:
controlling a timing of the substantially-random signal so that each of the plurality of channels samples an amplitude of a respective pulse of the substantially-random signal.

11. The method of claim 1, further comprising:
controlling a timing of the substantially-random signal so that each of the plurality of channels samples an edge of a respective pulse of the substantially-random signal.

12. The method of claim 1, wherein the substantially-random signal is injected into a common input point of the plurality of channels.

13. A device for calibrating an interleaved analog-to-digital converter (ADC), comprising:
an injection arrangement configured to inject a pulsed, substantially-random signal into a plurality of channels in the ADC;
a correlation arrangement configured to, after the substantially-random signal is injected, determine for each channel a gain correlation value indicating a degree of correlation between the injected substantially-random signal and an output of the respective channel; and
a correction arrangement configured to:
compare the gain correlation values to determine a degree of mismatch between the channels; and
calibrate at least one of the channels as a function of the determined degree of mismatch.

14. The device of claim 13, wherein the injection arrangement injects the substantially-random signal onto an analog input of the ADC, the analog input forming an input to each of the plurality of channels.

15. The device of claim 13, wherein the calibrating includes at least one of an analog and a digital adjustment to the at least one channel.

16. The device of claim 15, wherein the correction arrangement performs the adjustment by phase-shifting a clock input of the at least one channel.

17. The device of claim 15, wherein the correction arrangement performs the adjustment by changing an RC time constant of a stage in the at least one channel.

18. The device of claim 15, wherein the correction arrangement performs the adjustment by changing a value of a multiplier applied to an output of the least one channel.

19. The device of claim 13, wherein the correction arrangement determines the degree of mismatch by calculating a difference between the gain correlation value of the at least one channel and the gain correlation value of at least one additional channel.

20. The device of claim 13, wherein the injection arrangement controls a timing of the substantially-random signal so that each of the plurality of channels samples an amplitude of a respective pulse of the substantially-random signal.

21. The device of claim 13, wherein the injection arrangement controls a timing of the substantially-random signal so that each of the plurality of channels samples an edge of a respective pulse of the substantially-random signal.

22. The device of claim 13, wherein the injection arrangement injects the substantially-random signal into a common input point of the plurality of channels.

* * * * *